(12) United States Patent
Uchida et al.

(10) Patent No.: US 11,041,910 B2
(45) Date of Patent: Jun. 22, 2021

(54) ELECTRONIC DEVICE, BATTERY LIFE JUDGMENT METHOD, AND BATTERY LIFE JUDGMENT PROGRAM

(71) Applicant: YOKOGAWA ELECTRIC CORPORATION, Tokyo (JP)

(72) Inventors: Masayuki Uchida, Musashino (JP); Ken Kaku, Musashino (JP)

(73) Assignee: YOKOGAWA ELECTRIC CORPORATION, Tokyo (JP)

(*) Notice: Subject to any disclaimer, the term of this patent is extended or adjusted under 35 U.S.C. 154(b) by 193 days.

(21) Appl. No.: 16/298,102

(22) Filed: Mar. 11, 2019

(65) Prior Publication Data

US 2019/0302188 A1  Oct. 3, 2019

(30) Foreign Application Priority Data

Mar. 28, 2018 (JP) .............................. JP2018-062851

(51) Int. Cl.
*G01N 27/416* (2006.01)
*G01R 31/3835* (2019.01)
(Continued)

(52) U.S. Cl.
CPC ... *G01R 31/3835* (2019.01); *G01R 19/16542* (2013.01); *G01R 31/3646* (2019.01);
(Continued)

(58) Field of Classification Search
CPC .............. G01R 31/3835; G01R 31/396; G01R 19/16542; G01R 31/382; G01R 31/392;
(Continued)

(56) References Cited

U.S. PATENT DOCUMENTS 6,208,178 B1 * 3/2001 Chen ................ H03K 19/00315
326/27
6,222,235 B1 * 4/2001 Kojima ............... H01L 27/0266
257/355

(Continued)

FOREIGN PATENT DOCUMENTS

JP   H08195228 A   7/1996
JP   2001185233 A   7/2001
(Continued)

OTHER PUBLICATIONS

JP 2010-139396 Machine Translation; Dec. 12, 2008 (Year: 2008).*
JP 2002-340831 Machine Translation; Nov. 27, 2002 (Year: 2002).*

*Primary Examiner* — Raul J Rios Russo
(74) *Attorney, Agent, or Firm* — Kenja IP Law PC

(57) ABSTRACT

An electronic device includes a battery for supplying electrical power for operation of the electronic device, an acquisition unit configured to connect to a measuring instrument and acquire measurement data from the measuring instrument, a temperature sensor configured to measure a reference temperature, and a controller configured to correct the measurement data on the basis of the reference temperature. The controller acquires the terminal voltage of the battery and sets a lifespan voltage on the basis of the reference temperature. The lifespan voltage is used as a standard for outputting an alarm encouraging replacement of the battery before the terminal voltage of the battery falls below the voltage necessary for the electronic device to operate. The controller outputs the alarm when the terminal voltage is less than the lifespan voltage.

20 Claims, 7 Drawing Sheets

(51) Int. Cl.
*G01R 19/165* (2006.01)
*H01M 10/48* (2006.01)
*G01R 31/36* (2020.01)
*G01R 31/396* (2019.01)
*G01R 31/382* (2019.01)
*G01R 31/392* (2019.01)
*G01R 31/50* (2020.01)
G01R 31/3842 (2019.01)
G01R 31/385 (2019.01)

(52) U.S. Cl.
CPC ......... *G01R 31/382* (2019.01); *G01R 31/392* (2019.01); *G01R 31/396* (2019.01); *G01R 31/50* (2020.01); *H01M 10/486* (2013.01); *G01R 31/385* (2019.01); *G01R 31/3842* (2019.01)

(58) Field of Classification Search
CPC .. G01R 31/50; G01R 31/3842; G01R 31/385; G01R 31/3646; G01R 31/374; H01M 10/486; H01M 2200/00; H01M 10/42; Y02E 60/10
USPC ................... 324/76.11–76.83, 425, 426, 433
See application file for complete search history.

(56) References Cited

U.S. PATENT DOCUMENTS

| | | | | |
|---|---|---|---|---|
| 6,225,992 | B1* | 5/2001 | Hsu | G09G 3/3696 327/544 |
| 2009/0295332 | A1* | 12/2009 | Yang | H02J 7/0029 320/132 |
| 2013/0300346 | A1* | 11/2013 | Ishibashi | H02J 7/0013 320/107 |
| 2016/0149421 | A1* | 5/2016 | White | H02J 7/0021 320/121 |
| 2017/0349162 | A1* | 12/2017 | Kim | B60W 30/1882 |
| 2018/0115024 | A1* | 4/2018 | Sugeno | H02J 7/00 |
| 2018/0262043 | A1* | 9/2018 | Yl | H01M 10/443 |

FOREIGN PATENT DOCUMENTS

| | | |
|---|---|---|
| JP | 2002135439 A | 5/2002 |
| JP | 2002340831 A | 11/2002 |
| JP | 20058318761 A | 11/2005 |
| JP | 2010139396 A | 6/2010 |

\* cited by examiner

ELECTRONIC DEVICE, BATTERY LIFE JUDGMENT METHOD, AND BATTERY LIFE JUDGMENT PROGRAM

CROSS-REFERENCE TO RELATED APPLICATION

The present application claims priority to and the benefit of Japanese Patent Application No. 2018-62851 filed Mar. 28, 2018, the entire contents of which are incorporated herein by reference.

TECHNICAL FIELD

The present disclosure relates to an electronic device, a battery life judgment method, and a battery life judgment program.

BACKGROUND

A structure for judging the life of a battery that supplies electrical power to a device is known. For example, see patent literature (PTL) 1.

CITATION LIST

Patent Literature

PTL 1: JP2010139396A

SUMMARY

An electronic device according to an embodiment includes a battery, an acquisition unit, a temperature sensor, and a controller. The battery supplies electrical power for the electronic device to operate. The acquisition unit connects to a measuring instrument and acquires measurement data from the measuring instrument. The temperature sensor measures a reference temperature. The controller corrects the measurement data on the basis of the reference temperature. The controller acquires a terminal voltage of the battery. The controller sets a lifespan voltage on the basis of the reference temperature. The lifespan voltage is used as a standard for outputting an alarm encouraging replacement of the battery before the terminal voltage of the battery falls below a voltage necessary for the electronic device to operate. The controller outputs the alarm when the terminal voltage is less than the lifespan voltage.

A battery life judgment method according to an embodiment includes the step of acquiring a terminal voltage of a battery that supplies electrical power for operation of an electronic device that includes the battery. The battery life judgment method includes the step of acquiring measurement data from a measuring instrument. The battery life judgment method includes the step of measuring a reference temperature. The battery life judgment method includes the step of correcting the measurement data on the basis of the reference temperature. The battery life judgment method includes the step of setting a lifespan voltage on the basis of the reference temperature. The lifespan voltage is used as a standard for outputting an alarm encouraging replacement of the battery before the terminal voltage of the battery falls below a voltage necessary for the electronic device to operate. The battery life judgment method includes the step of outputting the alarm when the terminal voltage is less than the lifespan voltage.

A battery life judgment program according to an embodiment is for causing a processor functioning as a controller to execute the step of acquiring a terminal voltage of a battery that supplies electrical power for operation of an electronic device that includes the battery. The battery life judgment program causes the processor to execute the step of acquiring measurement data from a measuring instrument. The battery life judgment program causes the processor to execute the step of measuring a reference temperature. The battery life judgment program causes the processor to execute the step of correcting the measurement data on the basis of the reference temperature. The battery life judgment program causes the processor to execute the step of setting a lifespan voltage on the basis of the reference temperature. The lifespan voltage is used as a standard for outputting an alarm encouraging replacement of the battery before the terminal voltage of the battery falls below a voltage necessary for the electronic device to operate. The battery life judgment program causes the processor to execute the step of outputting the alarm when the terminal voltage is less than the lifespan voltage.

DETAILED DESCRIPTION

Figure 1:
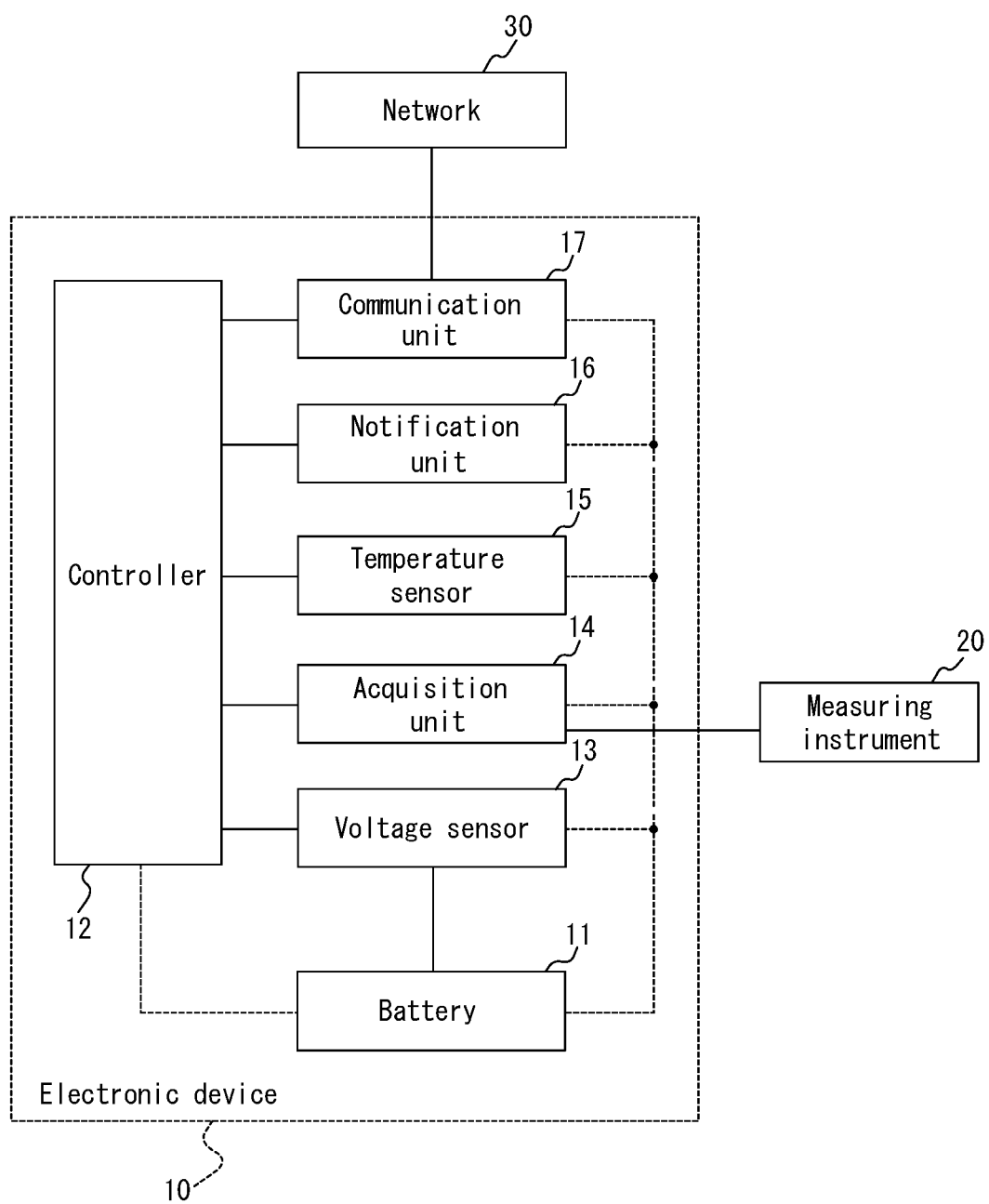
FIG. 1 is a block diagram illustrating an example schematic configuration of an electronic device according to an embodiment.

The accuracy of judging battery life can be improved by taking battery temperature into account. When the function to judge battery life is an accessory function of a device, then the temperature sensor for measuring the temperature of the battery may simply increase costs, without contributing to the inherent functionality of the device. Demand exists for judging battery life accurately while reducing costs.

An electronic device according to an embodiment includes a battery, an acquisition unit, a temperature sensor, and a controller. The battery supplies electrical power for the electronic device to operate. The acquisition unit connects to a measuring instrument and acquires measurement data from the measuring instrument. The temperature sensor measures a reference temperature. The controller corrects the measurement data on the basis of the reference temperature. The controller acquires a terminal voltage of the battery. The controller sets a lifespan voltage on the basis of the reference temperature. The lifespan voltage is used as a standard for outputting an alarm encouraging replacement of the battery before the terminal voltage of the battery falls below a voltage necessary for the electronic device to operate. The controller outputs the alarm when the terminal voltage is less than the lifespan voltage. With this configuration, the battery can be replaced before the electronic device stops operating, yet while the battery has as little remaining life as possible. Consequently, the battery life can be judged accurately while reducing costs.

An electronic device according to an embodiment may further include a communication unit configured to communicate with a high-level device. The controller may be configured to output the alarm to the high-level device via the communication unit when the terminal voltage is lower than the lifespan voltage. This allows the high-level device to collect the measurement data and manage the state of the electronic device.

An electronic device according to an embodiment may further include a protective diode connected in series to the battery. The battery may be configured to supply the electrical power to the electronic device through the protective diode. The controller may be configured to acquire a voltage including a voltage drop due to the protective diode as the terminal voltage and to set the lifespan voltage of the battery additionally on the basis of temperature characteristics of the protective diode. When the electronic device includes the protective diode, the application of reverse polarity voltage to the components of the electronic device could be prevented if the battery were to be attached backwards. Also, the battery life can be judged accurately by setting the lifespan voltage of the battery on the basis of the temperature characteristics of the protective diode.

In an electronic device according to an embodiment, the acquisition unit may be configured to acquire the measurement data at predetermined times. The controller may be configured to set the lifespan voltage of the battery additionally on the basis of the frequency of the predetermined times. This configuration can more appropriately determine the timing for replacing the battery.

In an electronic device according to an embodiment, the controller may be configured to output the alarm when it is judged that the terminal voltage is less than the lifespan voltage at least twice in a row. When the terminal voltage fluctuates around the lifespan voltage, this configuration reduces the likelihood of the alarm being repeatedly output and cancelled. The electronic device thus becomes more user-friendly.

In an electronic device according to an embodiment, the controller may be configured to cancel the alarm when the terminal voltage is judged to be equal to or greater than the lifespan voltage while the alarm is being output. This allows the alarm to be canceled automatically when the user replaces the battery in response to the alarm. This also allows the alarm to be canceled automatically when replacement of the battery becomes unnecessary due to a change in the temperature around the battery. The electronic device thus becomes more user-friendly.

In an electronic device according to an embodiment, the controller may be configured to cancel the alarm when the terminal voltage is judged to be equal to or greater than the lifespan voltage at least twice in a row while the alarm is being output. When the terminal voltage fluctuates around the lifespan voltage, this configuration reduces the likelihood of the alarm being repeatedly output and cancelled. The electronic device thus becomes more user-friendly.

An electronic device according to an embodiment may include at least two of the batteries connected in parallel. If one of the batteries is removed, the remaining batteries in this configuration can supply electrical power to the electronic device. Consequently, the battery can be replaced while the electronic device continues to operate.

As illustrated in FIG. 1, an electronic device 10 according to an embodiment includes a battery 11, a controller 12, an acquisition unit 14, and a temperature sensor 15. The electronic device 10 can connect to a measuring instrument 20 via the acquisition unit 14. The measuring instrument 20 may, for example, include a probe for measuring temperature or a probe for measuring another physical quantity, such as voltage. The measuring instrument 20 may be internal to the electronic device 10. The electronic device 10 may further include a voltage sensor 13 for measuring the terminal voltage of the battery 11. The electronic device 10 may further include a notification unit 16. The electronic device 10 may further include a communication unit 17. The electronic device 10 may connect to a network 30 via the communication unit 17.

The battery 11 electrically connects to each component of the electronic device 10, as illustrated by the dashed lines in FIG. 1. The battery 11 supplies electrical power to each component of the electronic device 10 to drive the electronic device 10. The battery 11 can also be considered to supply electrical power for the electronic device 10 itself to operate.

The controller 12 connects to each component of the electronic device 10, as illustrated by the solid lines in FIG. 1. The controller 12 acquires information from the components and controls the components. The controller 12 may include a processor such as a central processing unit (CPU). The controller 12 may implement the various functions of the electronic device 10 by executing a predetermined program. The controller 12 may include a memory. The electronic device 10 may include a memory as a separate component from the controller 12. The memory may store various information used for operations of the electronic device 10, programs for implementing the functions of the electronic device 10, and the like. The memory may function as a working memory of the controller 12. The memory may, for example, be a semiconductor memory.

The acquisition unit 14 acquires data related to measurement results from the measuring instrument 20 when connected to the measuring instrument 20. The data related to measurement results of the measuring instrument 20 is also referred to as measurement data. The acquisition unit 14 outputs the measurement data to the controller 12. The acquisition unit 14 may include an interface for acquiring measurement data from the measuring instrument 20. The acquisition unit 14 may include an A/D converter. The acquisition unit 14 may acquire an analog signal as the measurement data from the measuring instrument 20 and convert the analog signal to a digital signal with the A/D converter. When the measuring instrument 20 measures temperature, the measurement data output by the measuring instrument 20 is also referred to as temperature data.

The temperature sensor 15 measures the temperature of a predetermined portion of the electronic device 10. The temperature sensor 15 outputs the measurement to the controller 12. The value measured by the temperature sensor 15 can be used as a reference when correcting the measurement data, as described below. The value measured by the temperature sensor 15 is also referred to as the reference temperature. The temperature sensor 15 may output the reference temperature to the controller 12.

The measuring instrument 20 that connects to the acquisition unit 14 may be a thermocouple. The thermocouple includes two different types of metal wires that are joined at one end but not at the other end. The joined end is also referred to as the sensing junction. The ends that are not joined are also referred to as reference junctions. When a temperature difference exists between the sensing junction and the reference junctions, a potential difference corresponding to the temperature difference occurs at the nonjoined ends of the two different types of metal wires. In other words, the acquisition unit 14 can calculate the temperature at the sensing junction by acquiring the temperature of the reference junctions and the potential difference. When the measuring instrument 20 is a thermocouple, the acquisition unit 14 may include the reference junctions of the thermocouple and acquire the voltage corresponding to the electromotive force occurring at the sensing junction of the thermocouple as the temperature data. In this case, the temperature sensor 15 may measure the temperature using the reference junctions of the thermocouple included in the acquisition unit 14 as the predetermined portion. In other words, the temperature sensor 15 may measure the temperature of the reference junctions of the thermocouple as the reference temperature. The temperature data acquired by the acquisition unit 14 corresponds to the temperature difference between the sensing junction and the reference junctions. The controller 12 can calculate the temperature of the sensing junction of the thermocouple on the basis of the temperature data and the reference temperature. In other words, the controller 12 can correct the temperature data on the basis of the reference temperature.

The acquisition unit 14 is assumed here to include an A/D converter. The A/D converter may have temperature characteristics. For example, a threshold when converting an analog signal to a digital signal can change in accordance with a temperature change in the A/D converter. In other words, the correspondence relationship between the analog signal acquired from the measuring instrument 20 and the converted digital signal can change in accordance with a temperature change in the A/D converter. The temperature sensor 15 may, in this case, measure the temperature using the A/D converter included in the acquisition unit 14 as the predetermined portion. That is, the temperature sensor 15 may measure the temperature of the A/D converter as the reference temperature. The controller 12 may correct the measurement data by correcting the converted digital signal on the basis of the reference temperature and the temperature characteristics of the A/D converter.

In the present embodiment, the measurement data can be corrected to a higher degree of accuracy by the reference temperature being measured to as high a degree of accuracy as possible. That is, the temperature sensor 15 may have high measurement accuracy.

The notification unit 16 notifies the user of the electronic device 10 of content based on control information acquired from the controller 12. The notification unit 16 may include a light source, such as a light emission diode (LED). The notification unit 16 may make the light source turn on or flash to notify those nearby of content based on the control information acquired from the controller 12. The notification unit 16 may include a buzzer such as a piezoelectric buzzer or an electromagnetic buzzer, a speaker that emits predetermined audio, or the like. The notification unit 16 may sound the buzzer, emit audio, or the like to notify those nearby of content based on the control information acquired from the controller 12. The notification unit 16 may include a display device. The display device may, for example, be a liquid crystal display, an organic electro-luminescence (EL) display, an inorganic EL display, or the like. However, the display device is not limited to these examples and may be a different device. The notification unit 16 may display characters, images, or the like on the display device to provide notification of content based on the control information acquired from the controller 12.

The communication unit 17 communicably connects to the network 30.

The communication unit 17 transmits data based on control information acquired from the controller 12. The communication unit 17 may include a communication interface for a local area network (LAN) or the like. The communication unit 17 may communicably connect to the network 30 in a wired or wireless manner through the communication interface. The communication unit 17 may communicably connect to a high-level device, such as another apparatus or device, through the network 30. The communication unit 17 may communicably connect to a high-level device directly, without going through the network 30. The communication unit 17 may transmit data to a high-level device through the network 30 or transmit data to a high-level device directly without going through the network 30.

The controller 12 may transmit measurement data acquired from the measuring instrument 20 by the acquisition unit 14 to the network 30 or a high-level device through the communication unit 17. The controller 12 may correct the measurement data on the basis of the reference temperature and transmit the corrected measurement data through the communication unit 17. The accuracy of the measurement data output by the electronic device 10 can be improved by the controller 12 correcting the measurement data.

Figure 2:
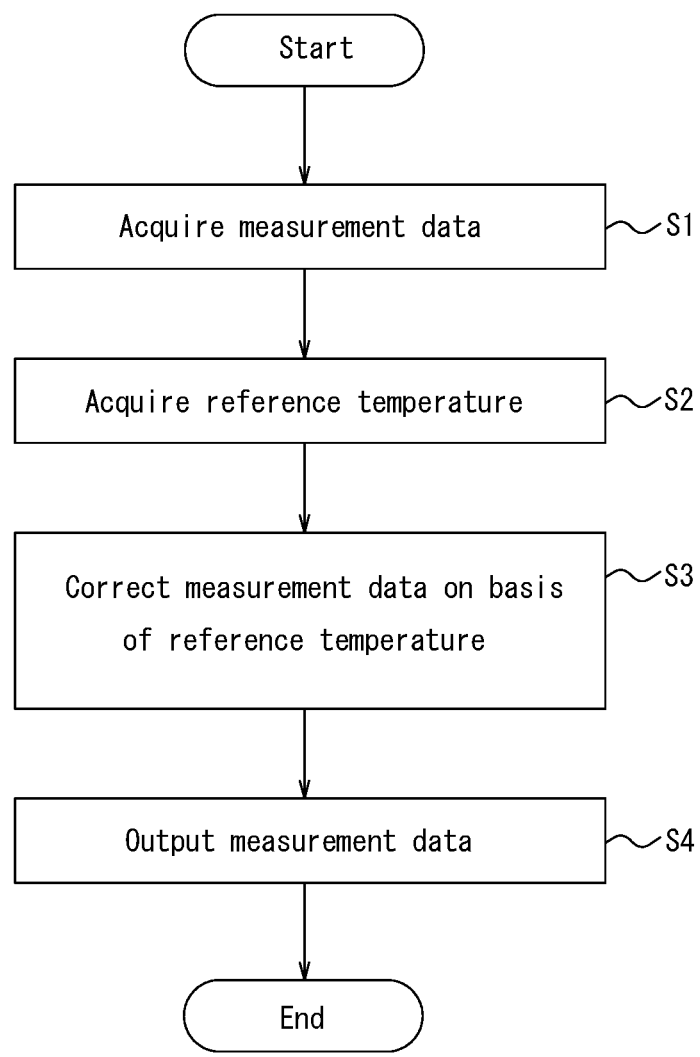
FIG. 2 is a flowchart illustrating example procedures for processing measurement data.

The electronic device 10 may execute the procedures of the example flowchart in FIG. 2.

The controller 12 acquires measurement data from the measuring instrument 20 using the acquisition unit 14 (step S1). The acquisition unit 14 may acquire an analog signal represented by current, voltage, or the like as the measurement data. When the measuring instrument 20 is a thermocouple, the acquisition unit 14 may acquire the voltage corresponding to the electromotive force of the thermocouple and output temperature data corresponding to the temperature difference between the sensing junction and the reference junctions to the controller 12. The acquisition unit 14 may output measurement data converted to a digital signal by the A/D converter to the controller 12.

The controller 12 acquires the reference temperature from the temperature sensor 15 (step S2). The temperature sensor 15 measures the temperature of a predetermined portion of the electronic device 10 as the reference temperature. When the measuring instrument 20 is a thermocouple, the predetermined portion may be the reference junctions of the thermocouple. The predetermined portion may be an A/D converter included in the acquisition unit 14. In other words, the reference temperature may be the temperature of the reference junctions of the thermocouple or the temperature of the A/D converter.

The controller 12 corrects the measurement data on the basis of the reference temperature (step S3). When the measuring instrument 20 is a thermocouple, the controller 12 may calculate the temperature of the sensing junction as the corrected measurement data on the basis of the reference temperature. The controller 12 may correct measurement data converted to a digital signal by the A/D converter of the acquisition unit 14 on the basis of the reference temperature and temperature characteristics of the A/D converter.

The controller 12 outputs the measurement data (step S4). The controller 12 may output the measurement data corrected in step S3 or output the measurement data acquired by the acquisition unit 14 without correction. The controller 12 may transmit the measurement data to the network 30 or a high-level device through the communication unit 17. The controller 12 ends the procedures of the flowchart in FIG. 2 after step S4.

The electronic device 10 of the present disclosure can correct the acquired measurement data on the basis of the reference temperature. This configuration can increase the accuracy of the measurement data that the electronic device 10 acquires and outputs. The electronic device 10 can also transmit the measurement data to the network 30 or a high-level device through the communication unit 17. This allows the high-level device to collect the measurement data and manage the state of the electronic device 10. The high-level device may be a data collection device such as SMARTDAC+® (SMARTDAC+ is a registered trademark in Japan, other countries, or both).

Figure 3:
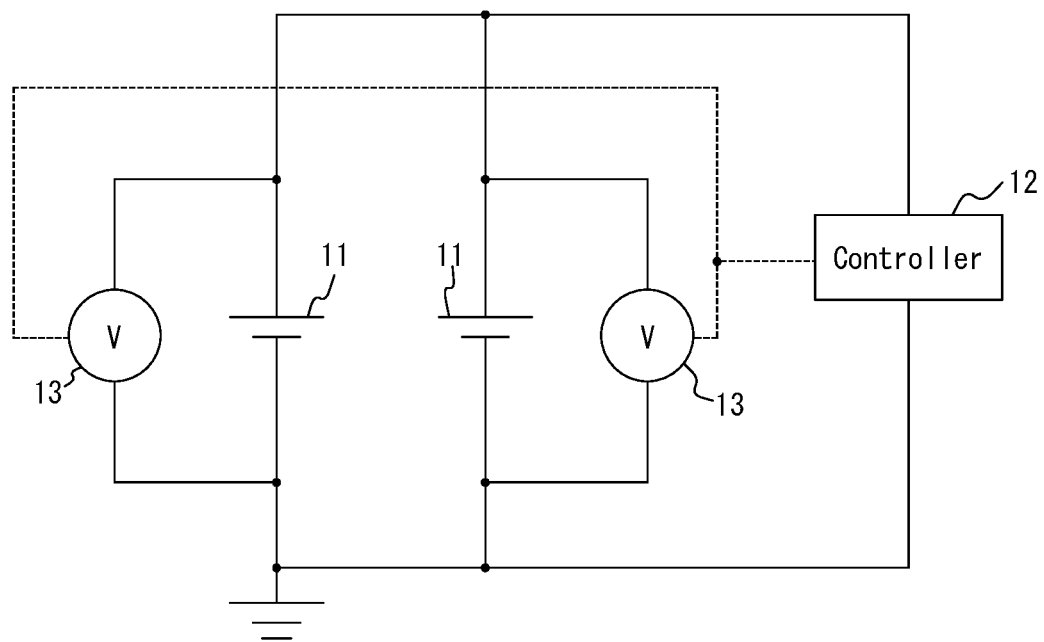
FIG. 3 is a circuit diagram illustrating an example of connecting batteries.

As illustrated in FIG. 3 the controller 12 may be connected to batteries 11 and receive supply of electrical power from the batteries 11. The example of connecting the batteries 11 and the controller 12 in FIG. 3 can also be applied to connection between the batteries 11 and other components of the electronic device 10. Each battery 11 is grounded at the terminal on the negative electrode side and is connected to the controller 12 at the terminal on the positive electrode side. Two batteries 11 are provided and are connected in parallel.

Each battery 11 has internal resistance. When the battery 11 outputs current, the terminal voltage of the battery 11 lowers due to a voltage drop caused by the internal resistance. In other words, as the current outputted by the battery 11 is higher, the terminal voltage of the battery 11 is lower. The current outputted by the battery 11 is also referred to simply as the output current. The terminal voltage of the battery 11 is also referred to simply as the terminal voltage.

The battery 11 applies the terminal voltage to each component of the electronic device 10. The voltage applied to each component of the electronic device 10 is also referred to as the applied voltage. The controller 12 connected to the batteries 11 in the example in FIG. 3 can measure the terminal voltage as the applied voltage.

The electronic device 10 may further include a voltage sensor 13, for measuring the terminal voltage of the battery 11, connected in parallel with the battery 11. Each voltage sensor 13 is communicably connected to the controller 12, as indicated by the dashed lines. The voltage sensor 13 outputs the measurement of the terminal voltage to the controller 12.

The number of batteries 11 provided in the electronic device 10 is not limited to two. Three or more batteries 11 may be provided. In other words, the electronic device 10 may include at least two batteries 11 connected in parallel. If one of the batteries 11 is removed from the electronic device 10 configured to include at least two batteries 11 connected in parallel, the remaining batteries 11 can supply electrical power to the electronic device 10. Since electrical power can be supplied to the electronic device 10 even when a battery 11 is removed, the battery 11 can be replaced while the electronic device 10 continues to operate. A single battery 11 may be provided in the electronic device 10. Provision of a single battery 11 can simplify the circuitry connected to the battery 11.

Each battery 11 is grounded at the terminal on the negative electrode side in the example in FIG. 3, but each battery 11 may be grounded at the terminal on the positive electrode side instead. When the batteries 11 are grounded at the terminal on the positive electrode side, the batteries 11 are connected to the controller 12 at the terminal on the negative electrode side.

When the terminal voltage lowers, the battery 11 might become unable to supply the minimum electrical power required for the electronic device 10 to continue to operate. The voltage required for the electronic device 10 to operate is also referred to as a first voltage. Replacement of the battery 11 before the terminal voltage of the battery 11 falls below the first voltage allows the electronic device 10 to continue to operate. The first voltage can be determined on the basis of the configuration of the electronic device 10.

The controller 12 sets a second voltage used as a reference for outputting an alarm to encourage replacement of the battery 11 before the terminal voltage of the battery 11 drops below the first voltage. The second voltage is set higher than the first voltage. When the terminal voltage has dropped below the second voltage, the controller 12 may output the alarm to encourage the user of the electronic device 10 to replace the battery 11. The controller 12 may set the second voltage taking into account the time necessary to replace the battery 11. This allows the battery 11 to be replaced easily before the terminal voltage of the battery 11 reaches the first voltage. Consequently, the electronic device 10 can continue to operate. The second voltage is also referred to as the lifespan voltage of the battery 11.

The controller 12 may output control information related to the alarm to the notification unit 16 and cause the notification unit 16 to provide notification of the alarm. The notification unit 16 may, for example, emit red light to indicate the state in which the controller 12 is outputting the alarm. The notification unit 16 may, for example, emit green light to indicate the state in which the controller 12 is operating without outputting the alarm. These examples are not limiting, and the notification unit 16 may provide notification of the alarm in various other ways. It becomes easier for the user of the electronic device 10 to notice the alarm when the notification unit 16 provides notification of the alarm.

The controller 12 may output control information related to the alarm to the communication unit 17 and may cause the communication unit 17 to transmit the alarm to the network 30 or to a high-level device, such as another apparatus or device. Transmission of the alarm from the communication unit 17 to the high-level device allows the high-level device to manage the state of the electronic device 10. When a plurality of electronic devices 10 each communicate with the high-level device through the communication unit 17, the high-level device can collectively manage the electronic devices 10. The electronic devices 10 are therefore easy to manage.

For the same output current, the terminal voltage decreases more quickly as the temperature around the battery 11 is lower. The controller 12 may set the second voltage to a higher value as the temperature around the battery 11 is lower. This prevents the time from when the alarm is output until the terminal voltage of the battery 11 falls below the first voltage from becoming too short when the temperature around the battery 11 is low. In other words, the time from when the alarm is output until the battery 11 is replaced can easily be ensured regardless of the temperature around the battery 11. Consequently, the electronic device 10 can more easily continue to operate.

In a temperature range lower than room temperature, the voltage drop due to the internal resistance of the battery 11 may increase as the temperature around the battery 11 is lower. Conversely, in a temperature range higher than room temperature, the voltage drop due to the internal resistance of the battery 11 may increase as the temperature around the battery 11 is higher. In other words, when the temperature around the battery 11 is too much lower or higher than room temperature, the terminal voltage may significantly decrease. Room temperature may, for example, be defined as 15° C. to 25° C. The controller 12 may set the second voltage on the basis of the relationship between the temperature around the battery 11 and the magnitude of the voltage drop due to the internal resistance of the battery 11. The controller 12 may, for example, set the second voltage to a higher value as the voltage drop due to the internal resistance of the battery 11 is larger. This easily ensures the time from when the alarm is output until the battery 11 is replaced. The controller 12 may set the second voltage additionally on the basis of the magnitude of the output current of the battery 11.

The temperature around the battery 11 can be calculated on the basis of the reference temperature measured by the temperature sensor 15. When the battery 11 is located near the predetermined portion that is measured by the temperature sensor 15, the temperature around the battery 11 can approach the reference temperature, which is the value measured by the temperature sensor 15. When the predetermined portion is the acquisition unit 14, for example, the battery 11 may be disposed in the electronic device 10 within a predetermined distance from the acquisition unit 14.

The correlation between the temperature around the battery 11 and the reference temperature can be determined on the basis of the positional relationship between the battery 11 and the predetermined portion. The correlation between the temperature around the battery 11 and the reference temperature is also referred to as the temperature correlation. The temperature correlation may, for example, be expressed in table form or expressed as a function, such as a linear function. The temperature correlation may be stored in the memory. The controller 12 may set the second voltage on the basis of the reference temperature and the temperature correlation.

When the controller 12 sets the second voltage on the basis of the reference temperature, the correlation between the second voltage and the reference temperature can be expressed as a predetermined relationship. The predetermined relationship may be determined on the basis of the temperature characteristics of the battery 11. The predetermined relationship may, for example, be expressed in table form or expressed as a function, such as a linear function. The predetermined relationship may be stored in the memory. The controller 12 may set the second voltage on the basis of the reference temperature and the predetermined relationship.

Figure 4:
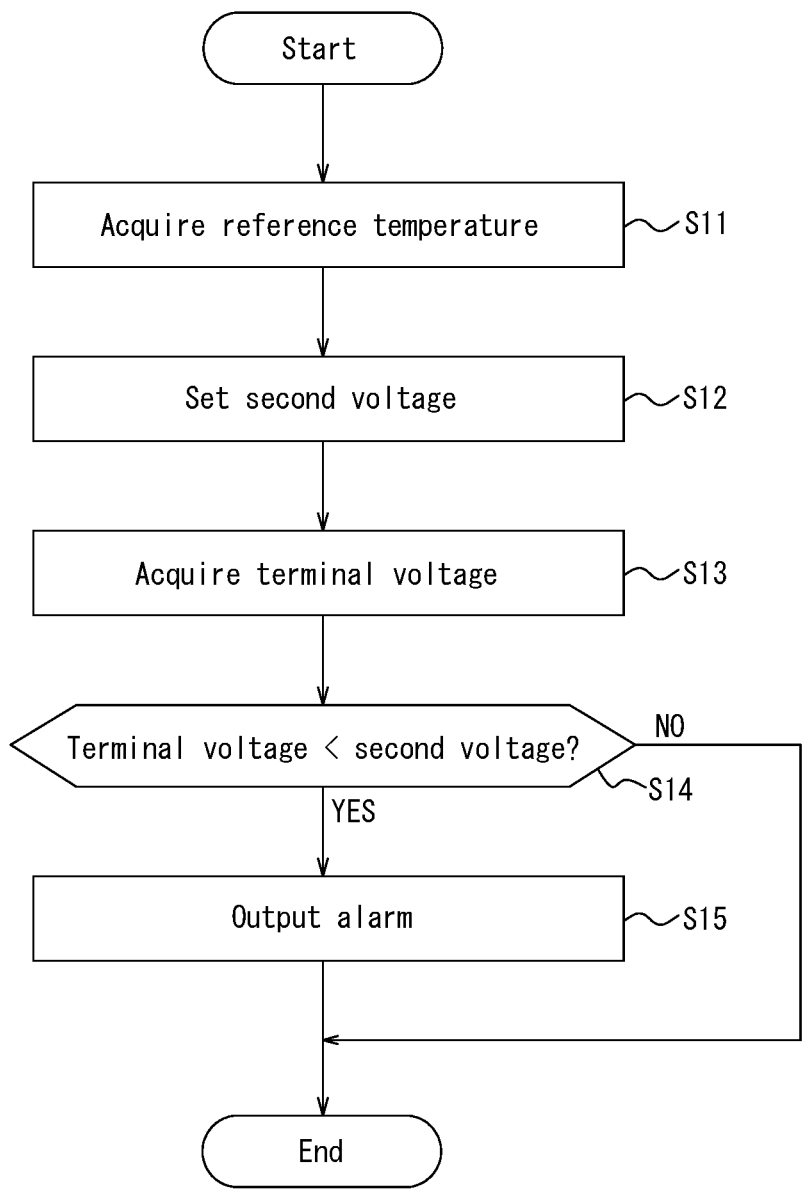
FIG. 4 is a flowchart illustrating example procedures for outputting an alarm.

The electronic device 10 may follow the procedures of the flowchart in FIG. 4 to output an alarm encouraging the user of the electronic device 10 to replace the battery 11.

The controller 12 acquires the reference temperature from the temperature sensor 15 (step S11). The controller 12 may execute a procedure that is the same as or similar to that of step S2 in FIG. 2.

The controller 12 sets the second voltage (lifespan voltage) on the basis of the reference temperature (step S12). The controller 12 may set the second voltage higher as the reference temperature is lower.

The controller 12 acquires the terminal voltage (step S13). The controller 12 may measure and acquire the applied voltage as the terminal voltage. The controller 12 may acquire the value measured by the voltage sensor 13 as the terminal voltage.

The controller 12 judges whether the terminal voltage is less than the second voltage (lifespan voltage) (step S14). When the terminal voltage is less than the second voltage (step S14: YES), the controller 12 outputs an alarm to encourage the user of the electronic device 10 to replace the battery 11 (step S15). The controller 12 ends the procedures of the flowchart in FIG. 4 after step S15. When the controller 12 outputs the alarm in step S15, the alarm may continue to be outputted after the procedures in FIG. 4 are complete. When the terminal voltage is not less than the second voltage (step S14: NO), the controller 12 skips the procedure of step S15 and ends the procedures of the flowchart in FIG. 4.

While the alarm is being outputted, the controller 12 may execute the procedures of FIG. 4 again. While the alarm is being outputted, the controller 12 may cancel the alarm when the terminal voltage is judged not to be less than the second voltage. The alarm may be canceled by the user operating the electronic device 10.

The electronic device 10 according to the present embodiment outputs an alarm encouraging replacement of the battery 11 before the terminal voltage of the battery 11 falls below the second voltage (lifespan voltage). The electronic device 10 sets the second voltage (lifespan voltage) of the battery 11 on the basis of the reference temperature. This configuration can, for example, prevent the terminal voltage of the battery 11 from falling below the first voltage. This can also avoid replacement of the battery 11 while the terminal voltage of the battery 11 is still sufficiently high. In other words, the battery 11 can be replaced in the present embodiment before the electronic device 10 stops operating yet while the battery 11 has as little remaining life as possible. The life of the battery 11 can thus be judged accurately. Consequently, the cost of replacing the battery 11 can be reduced, and the electronic device 10 can more easily continue to operate.

While the alarm is being outputted, the electronic device 10 of the present embodiment may cancel the alarm when the terminal voltage is judged to be equal to or greater than the second voltage. This allows the alarm to be canceled automatically when the user replaces the battery 11 in response to the alarm. This also allows the alarm to be canceled automatically when replacement of the battery 11 becomes unnecessary due to a change in the temperature around the battery 11. The electronic device 10 thus becomes more user-friendly.

The electronic device 10 according to the present embodiment includes the temperature sensor 15 that acquires the reference temperature and the acquisition unit 14 that acquires the measurement data from the measuring instrument 20. The electronic device 10 corrects the measurement data, acquired by the acquisition unit 14, on the basis of the reference temperature. This configuration can improve the accuracy of the measurement data.

The electronic device 10 according to the present embodiment sets the second voltage (lifespan voltage) of the battery 11 on the basis of the reference temperature used to correct the measurement data. If a device according to a comparative example were to include the battery 11 and a dedicated sensor for measuring the temperature of the battery 11, this device would judge whether it was time to replace the battery 11 on the basis of the temperature of the battery 11 measured by the dedicated sensor. By contrast, the electronic device 10 according to the present embodiment does not require a dedicated sensor for measuring the temperature around the battery 11. The present embodiment can therefore reduce costs of the electronic device 10 by virtue of having a simpler configuration and can accurately judge the life of the battery 11.

Figure 5:
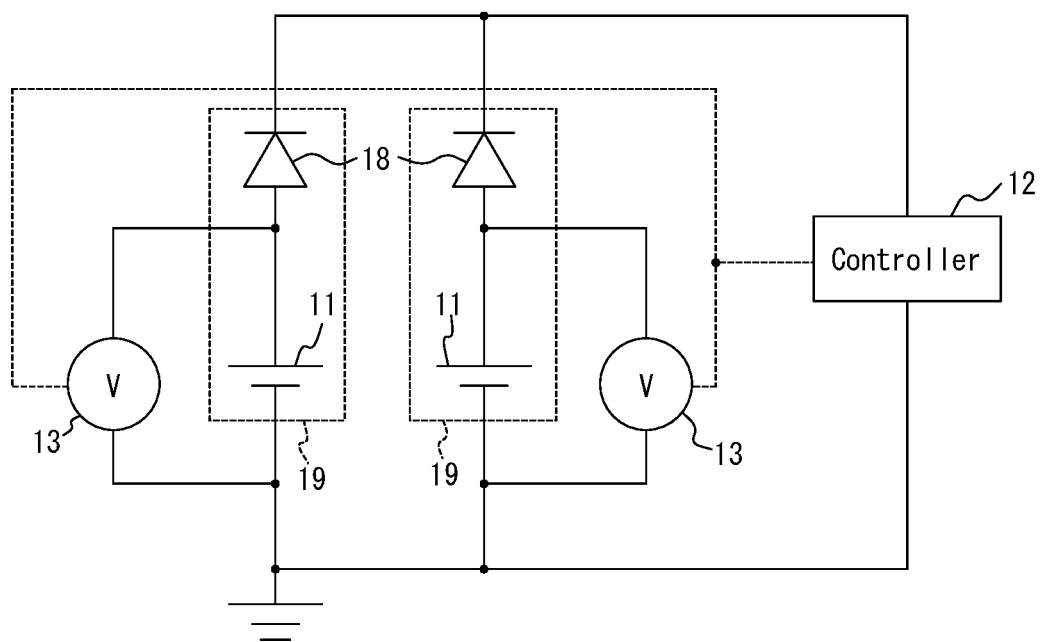
FIG. 5 is a circuit diagram illustrating an example of connecting batteries and protective diodes.

As illustrated in FIG. 5, the electronic device 10 according to an embodiment may further include a protective diode 18. As compared to the circuit in FIG. 3, the circuit in FIG. 5 further includes protective diodes 18, with one protective diode 18 connected in series to the terminal of each battery 11 on the positive electrode side. The protective diode 18 is connected so that the direction from the terminal of the battery 11 on the positive electrode side towards the controller 12 is the forward direction. If the battery 11 were to be attached in the opposite direction from the direction illustrated in FIG. 5, the protective diode 18 could prevent reverse polarity voltage from being applied to the components of the electronic device 10.

When the electronic device 10 includes the protective diode 18, a voltage drop also occurs at the protective diode 18. The voltage applied to the components of the electronic device 10 in this case is the result of subtracting the magnitude of the voltage drop at the protective diode 18 from the terminal voltage of the battery 11. The configuration in which the battery 11 and the protective diode 18 are connected in series is also referred to as a voltage application unit 19. In other words, the terminal voltage of the voltage application unit 19 becomes the voltage applied to the components such as the controller 12. The terminal voltage of the voltage application unit 19 corresponds to the result of subtracting the magnitude of the voltage drop at the protective diode 18 from the terminal voltage of the battery 11.

When the terminal voltage of the voltage application unit 19 falls below the first voltage, the battery 11 cannot supply the minimum electrical power required for the components of the electronic device 10 to operate. Replacement of the battery 11 before the terminal voltage of the voltage application unit 19 falls below the first voltage allows the components of the electronic device 10 to continue to operate. The first voltage can be determined on the basis of the configuration of the electronic device 10 that includes the protective diode 18.

The electronic device 10 may further include a voltage sensor 13. The voltage sensor 13 may be connected in parallel with only the battery 11, instead of being connected in parallel with the entire voltage application unit 19 in which the battery 11 and the protective diode 18 are connected in series. By virtue of being connected in parallel with only the battery 11, the voltage sensor 13 can measure the terminal voltage of the battery 11 regardless of whether the electronic device 10 includes the protective diode 18. Each voltage sensor 13 is communicably connected to the controller 12, as indicated by the dashed lines. The voltage sensor 13 outputs the measurement to the controller 12. The controller 12 can acquire the terminal voltage of the battery 11. The voltage sensor 13 may be connected in parallel to the entire voltage application unit 19. In this case, the voltage sensor 13 acquires the measurement of the terminal voltage of the voltage application unit 19.

Each battery 11 is grounded at the terminal on the negative electrode side in the example in FIG. 5, but each battery 11 may be grounded at the terminal on the positive electrode side instead. When the batteries 11 are grounded at the terminal on the positive electrode side, the batteries 11 are connected to the controller 12 at the terminal on the negative electrode side. In this case, the protective diode 18 is connected to have opposite polarity from the polarity illustrated in FIG. 5.

The controller 12 may set the second voltage on the basis of the first voltage, the magnitude of the voltage drop due to the internal resistance of the battery 11, and the magnitude of the voltage drop due to the protective diode 18. The protective diode 18 has temperature characteristics. For example, the voltage drop due to the protective diode 18 may increase as the temperature around the protective diode 18 is lower. The controller 12 may set the second voltage additionally on the basis of the temperature characteristics of the protective diode 18. In other words, the controller 12 may set the second voltage taking into account the temperature characteristics of the voltage drop due to the protective diode 18. The controller 12 may, for example, set the second voltage to a higher value as the voltage drop due to the protective diode 18 is larger. The controller 12 may set the second voltage additionally on the basis of the magnitude of the output current of the battery 11.

The controller 12 may set the second voltage on the basis of a predetermined relationship expressing the correlation between the second voltage and the reference temperature. The predetermined relationship may be determined on the basis of not only the temperature characteristics of the battery 11 but also the temperature characteristics of the protective diode 18. In this way, the second voltage can easily be set regardless of an increase in parameters.

The content of each procedure executed by the controller 12 in the flowchart of FIG. 4 may be modified when the electronic device 10 includes the protective diode 18. In the procedure of step S12, the controller 12 may set the second voltage additionally on the basis of the temperature characteristics of the protective diode 18. In the procedure of step S13, the controller 12 may acquire the terminal voltage of the voltage application unit 19 instead of acquiring the terminal voltage of the battery 11. In the procedure of step S14, the controller 12 may determine whether the terminal voltage of the voltage application unit 19 is less than the second voltage instead of determining whether the terminal voltage of the battery 11 is less than the second voltage.

The electronic device 10 according to the present embodiment can set the second voltage (lifespan voltage) of the battery 11 additionally taking into account the temperature characteristics of the protective diode 18. This configuration can more appropriately determine the timing for replacing the battery 11. Consequently, the electronic device 10 can more easily continue to operate.

The electronic device 10 according to an embodiment can acquire measurement data from the measuring instrument 20, correct the measurement data on the basis of the reference temperature, and output the corrected measurement data in accordance with the procedures of the example flowchart in FIG. 2. The electronic device 10 may acquire, correct, and output the measurement data as a sequence of operations.

The electronic device 10 can intermittently execute this sequence of operations at predetermined measurement times. The measurement times may occur cyclically or at different time intervals. The electronic device 10 may operate the temperature sensor 15 and the acquisition unit 14 at the time of executing the sequence of operations. In other words, the electronic device 10 may intermittently operate the temperature sensor 15 and the acquisition unit 14 at the measurement times. The electrical power that the battery 11 supplies to the electronic device 10 could increase as the measurement times occur more frequently. In other words, the terminal voltage of the battery 11 could drop more quickly as the measurement times occur more frequently. The frequency of the measurement times is also referred to as the measurement frequency.

The controller 12 may set the second voltage on the basis of not only the reference temperature but also the measurement frequency. The controller 12 may, for example, set the second voltage higher as the measurement frequency is higher. This configuration can more appropriately determine the timing for replacing the battery 11.

When the controller 12 sets the second voltage additionally on the basis of the measurement frequency, the predetermined relationship expressing the correlation between the second voltage and the reference temperature may further include a correlation with the measurement frequency. In other words, the controller 12 may set the second voltage on the basis of the correlation between the second voltage, the reference temperature, and the measurement frequency. In this way, the second voltage can easily be set regardless of an increase in parameters.

When the electronic device 10 according to the present embodiment executes the step of judging whether the terminal voltage is less than the second voltage two times or more, the electronic device 10 may output the alarm when judging that the terminal voltage is less than the second voltage at least twice in a row. The electronic device 10 may cancel the alarm when judging that the terminal voltage is equal to or greater than the second voltage at least twice in a row.

Figure 6:
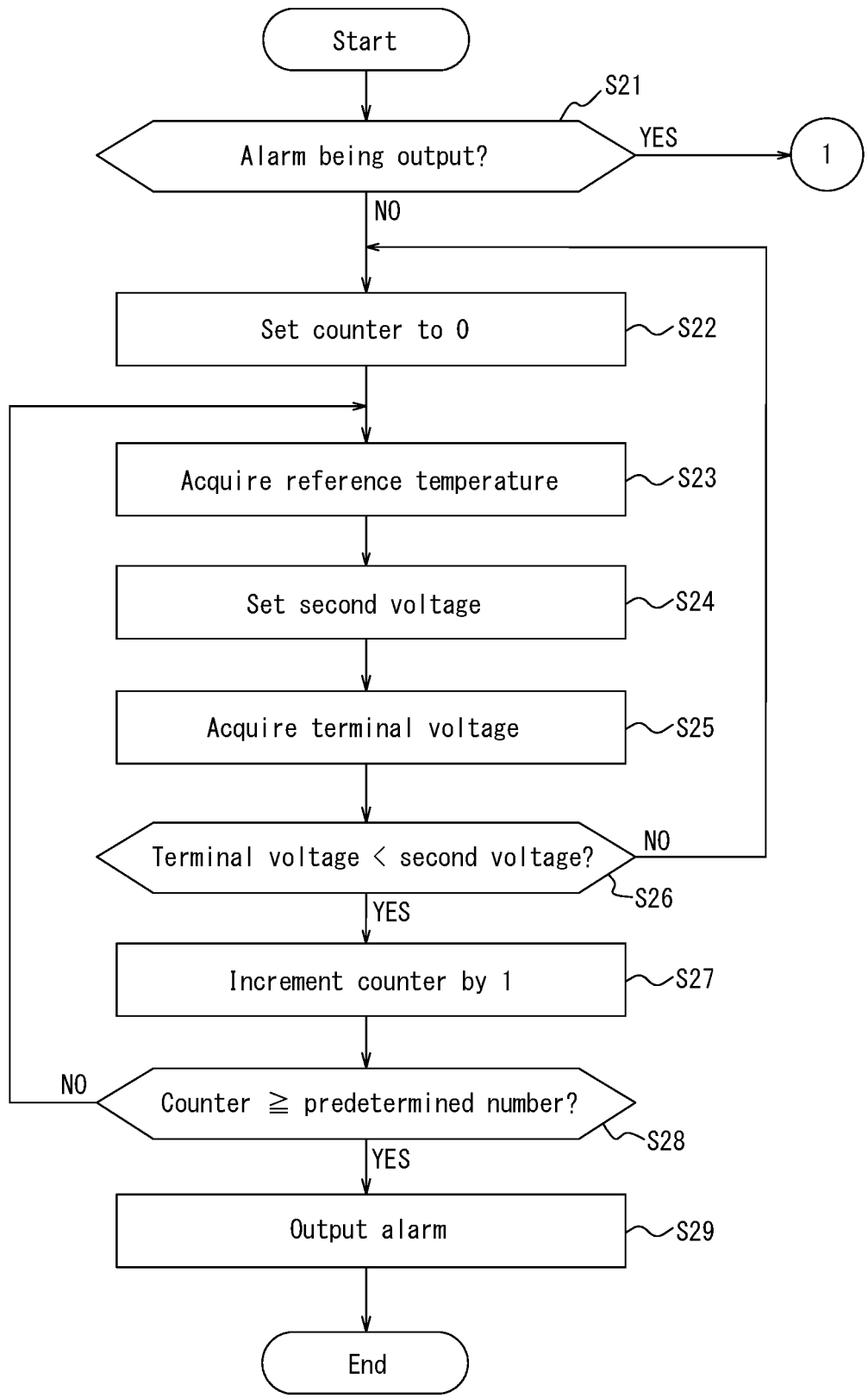
FIG. 6 is a flowchart illustrating example procedures for outputting an alarm after judging a plurality of times.
Figure 7:
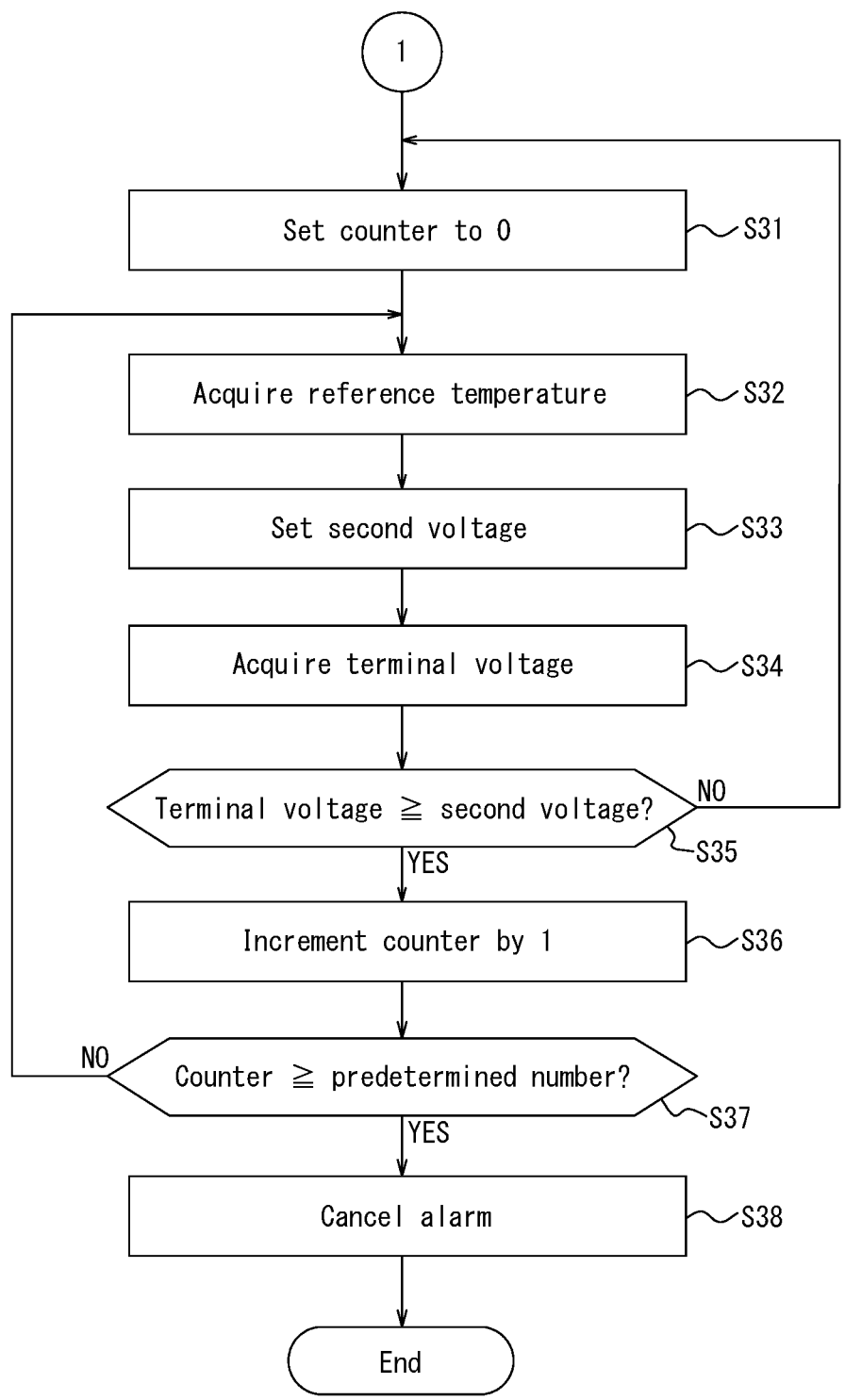
FIG. 7 is a flowchart illustrating example procedures for canceling an alarm after judging a plurality of times.

The electronic device 10 may follow the procedures of the flowcharts in FIG. 6 and FIG. 7 to output or cancel an alarm encouraging the user of the electronic device 10 to replace the battery 11.

The controller 12 judges whether the alarm is being output (step S21). When the alarm is being output (step S21: YES), the controller 12 proceeds to step S31 of the flowchart in FIG. 7.

When the alarm is not being output (step S21: NO), the controller 12 sets the counter to 0 (step S22).

The controller 12 acquires the reference temperature from the temperature sensor 15 (step S23). The controller 12 may execute a procedure that is the same as or similar to that of step S2 in FIG. 2.

The controller 12 sets the second voltage (lifespan voltage) on the basis of the reference temperature (step S24). The controller 12 may execute a procedure that is the same as or similar to that of step S12 in FIG. 4.

The controller 12 acquires the terminal voltage (step S25). The controller 12 may execute a procedure that is the same as or similar to that of step S13 in FIG. 4.

The controller 12 judges whether the terminal voltage is less than the second voltage (lifespan voltage) (step S26). When the terminal voltage is not less than the second voltage (step S26: NO), the controller 12 returns to the procedure of step S22 and resets the counter to 0. When the terminal voltage is less than the second voltage (step S26: YES), the controller 12 increments the counter by 1 (step S27). In other words, the counter represents the number of times in a row that the terminal voltage is judged to be less than the second voltage.

The controller 12 judges whether the counter is equal to or greater than a predetermined number (step S28). The predetermined number may be two, or the predetermined number may be three or more. When the counter is not equal to or greater than the predetermined number (step S28: NO), the controller 12 returns to the procedure of step S23. In this case, the controller 12 does not reset the counter to 0. When the counter is equal to or greater than a predetermined number (step S28: YES), the controller 12 outputs an alarm to encourage the user of the electronic device 10 to replace the battery 11 (step S29). The controller 12 ends the procedures of the flowchart in FIG. 6 after step S29.

When the alarm is not being output (step S21 of FIG. 6: NO), the controller 12 sets the counter to 0 (step S31 of FIG. 7).

In the procedures of steps S32 to S34, the controller 12 executes a procedure that is the same as or similar to that of steps S23 to S25 of FIG. 6 and then advances to the procedure of step S35.

The controller 12 judges whether the terminal voltage is equal to or greater than the second voltage (step S35). When the terminal voltage is not equal to or greater than the second voltage (step S35: NO), the controller 12 returns to the procedure of step S31 and resets the counter to 0. When the terminal voltage is equal to or greater than the second voltage (step S35: YES), the controller 12 increments the counter by 1 (step S36). In other words, the counter represents the number of times in a row that the terminal voltage is judged to be equal to or greater than the second voltage.

The controller 12 judges whether the counter is equal to or greater than a predetermined number (step S37). The predetermined number may be two, or the predetermined number may be three or more. When the counter is not equal to or greater than the predetermined number (step S37: NO), the controller 12 returns to the procedure of step S32. In this case, the controller 12 does not reset the counter to 0. When the counter is equal to or greater than a predetermined number (step S37: YES), the controller 12 cancels the alarm (step S38). The controller 12 ends the procedures of the flowchart in FIG. 7 after step S38.

When the terminal voltage is judged to be less than the lifespan voltage at least twice in a row while the alarm is not being output, the electronic device 10 according to the present embodiment outputs the alarm encouraging the user to replace the battery 11. Furthermore, when the terminal voltage is judged to be equal to or greater than the lifespan voltage at least twice in a row while the alarm is being output, the electronic device 10 according to the present embodiment outputs the alarm encouraging the user to replace the battery 11. When the terminal voltage fluctuates around the lifespan voltage, this configuration reduces the likelihood of the alarm being repeatedly output and cancelled. The electronic device 10 thus becomes more user-friendly.

In the example procedures in FIG. 6 and FIG. 7, the controller 12 sets the second voltage upon each comparison between the terminal voltage and the second voltage. This configuration facilitates adaption to changing circumstances, such as a change in the temperature around the battery 11, when the controller 12 judges the life of the battery 11. The procedures executed by the controller 12 are not limited to this example. After setting the second voltage, the controller 12 may compare the terminal voltage and the second voltage two or more times in a row. In other words, after the second voltage is set once, it may be used in two or more comparisons. This can reduce the operation load of the controller 12.

The electronic device 10 according to an embodiment may acquire the terminal voltage at least twice. The electronic device 10 may process at least two sets of terminal voltage data by performing calculations such as averaging and may judge whether the processing result is less than the lifespan voltage. When the electronic device 10 makes at least two judgments or acquires the terminal voltage at least twice, the time to replace the battery 11 can be determined on the basis of the measurement history of the terminal voltage. With this configuration, the electronic device 10 can more appropriately determine the timing for replacing the battery 11.

The example procedures in the embodiments of the present disclosure may be included in a battery life judgment method and in a battery life judgment program executed by a processor functioning as the controller 12.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure. For example, the functions or the like included in the various components or steps may be reordered in any logically consistent way. Furthermore, components or steps may be combined into one or divided.

The invention claimed is:

1. An electronic device comprising:
a battery configured to supply electrical power for operation of the electronic device;
an A/D converter configured to, when connected to a measuring instrument, acquire an analog signal from the measuring instrument, to convert the analog signal to a digital signal and to output the digital signal as measurement data, wherein the A/D converter is disposed within a predetermined distance from the battery;
a temperature sensor configured to measure a temperature of the A/D converter as a reference temperature; and
a controller configured to correct the measurement data on the basis of the reference temperature;
wherein the controller is configured to
acquire a terminal voltage of the battery;
set a lifespan voltage on the basis of the reference temperature, the lifespan voltage being used as a standard for outputting an alarm encouraging replacement of the battery before the terminal voltage of the battery falls below a voltage necessary for the electronic device to operate; and
output the alarm when the terminal voltage is less than the lifespan voltage.

2. The electronic device of claim 1, further comprising:
a communication interface configured to transmit data to a data collection device;
wherein the controller is configured to output the alarm to the collection device via the communication unit when the terminal voltage is lower than the lifespan voltage.

3. The electronic device of claim 1, further comprising:
a protective diode connected in series to the battery;
wherein the battery is configured to supply the electrical power to the electronic device through the protective diode; and
wherein the controller is configured to acquire a voltage including a voltage drop due to the protective diode as the terminal voltage and to set the lifespan voltage of the battery additionally on the basis of temperature characteristics of the protective diode.

4. The electronic device of claim 2, further comprising:
a protective diode connected in series to the battery;
wherein the battery is configured to supply the electrical power to the electronic device through the protective diode; and
wherein the controller is configured to acquire a voltage including a voltage drop due to the protective diode as the terminal voltage and to set the lifespan voltage of the battery additionally on the basis of temperature characteristics of the protective diode.

5. The electronic device of claim 1,
wherein the acquisition unit is configured to acquire the measurement data at predetermined times; and
wherein the controller is configured to set the lifespan voltage of the battery additionally on the basis of a frequency of the predetermined times.

6. The electronic device of claim 2,
wherein the acquisition unit is configured to acquire the measurement data at predetermined times; and
wherein the controller is configured to set the lifespan voltage of the battery additionally on the basis of a frequency of the predetermined times.

7. The electronic device of claim 3,
wherein the acquisition unit is configured to acquire the measurement data at predetermined times; and
wherein the controller is configured to set the lifespan voltage of the battery additionally on the basis of a frequency of the predetermined times.

8. The electronic device of claim 4,
wherein the acquisition unit is configured to acquire the measurement data at predetermined times; and
wherein the controller is configured to set the lifespan voltage of the battery additionally on the basis of a frequency of the predetermined times.

9. The electronic device of claim 1, wherein the controller is configured to output the alarm when it is judged that the terminal voltage is less than the lifespan voltage at least twice in a row.

10. The electronic device of claim 1, wherein the controller is configured to cancel the alarm when the terminal voltage is judged to be equal to or greater than the lifespan voltage while the alarm is being output.

11. The electronic device of claim 1, wherein the controller is configured to cancel the alarm when the terminal voltage is judged to be equal to or greater than the lifespan voltage at least twice in a row while the alarm is being output.

12. The electronic device of claim 1, comprising at least two of the batteries connected in parallel.

13. A battery life judgment method comprising:
acquiring a terminal voltage of a battery configured to supply electrical power for operation of an electronic device comprising the battery;
acquiring measurement data from a measuring instrument by an A/D converter disposed within a predetermined distance from the battery;
measuring a temperature of the A/D converter as a reference temperature;
correcting the measurement data on the basis of the reference temperature;
setting a lifespan voltage on the basis of the reference temperature, the lifespan voltage being used as a standard for outputting an alarm encouraging replacement of the battery before the terminal voltage of the battery falls below a voltage necessary for the electronic device to operate; and
outputting the alarm when the terminal voltage is less than the lifespan voltage.

14. The battery life judgment method of claim 13, further comprising outputting the alarm, when the terminal voltage is lower than the lifespan voltage, to a data collection device via a communication unit configured to communicate with the data collection device.

15. The battery life judgment method of claim 13, further comprising:
acquiring, as the terminal voltage, a voltage including a voltage drop due to a protective diode connected in series to the battery; and setting the lifespan voltage of the battery additionally on the basis of temperature characteristics of the protective diode.

16. The battery life judgment method of claim 13, further comprising:
   acquiring the measurement data at predetermined times; and
   setting the lifespan voltage of the battery additionally on the basis of a frequency of the predetermined times.

17. A non-transitory computer readable medium storing a battery life judgment program for causing a processor functioning as a controller to:
   acquire a terminal voltage of a battery configured to supply electrical power for operation of an electronic device comprising the battery;
   acquire measurement data from a measuring instrument by an A/D converter disposed within a predetermined distance from the battery;
   measure a temperature of the A/D converter as a reference temperature;
   correct the measurement data on the basis of the reference temperature;
   set a lifespan voltage on the basis of the reference temperature, the lifespan voltage being used as a standard for outputting an alarm encouraging replacement of the battery before the terminal voltage of the battery falls below a voltage necessary for the electronic device to operate; and
   output the alarm when the terminal voltage is less than the lifespan voltage.

18. The non-transitory computer readable medium of claim 17, wherein the battery life judgment program further comprises causing the processor to output the alarm, when the terminal voltage is lower than the lifespan voltage, to a data collection device via a communication unit configured to communicate with the data collection device.

19. The non-transitory computer readable medium of claim 17, wherein the battery life judgment program further comprises causing the processor to:
   acquire, as the terminal voltage, a voltage including a voltage drop due to a protective diode connected in series to the battery; and
   set the lifespan voltage of the battery additionally on the basis of temperature characteristics of the protective diode.

20. The non-transitory computer readable medium of claim 17, wherein the battery life judgment program further comprises causing the processor to:
   acquire the measurement data at predetermined times; and
   set the lifespan voltage of the battery additionally on the basis of a frequency of the predetermined times.

* * * * *